United States Patent
Choi

(10) Patent No.: US 6,270,942 B1
(45) Date of Patent: Aug. 7, 2001

(54) PHOTOSENSITIVE POLYMER HAVING CYCLIC BACKBONE AND RESIST COMPOSITION COMPRISING THE SAME

(75) Inventor: Sang-jun Choi, Seoul (KR)

(73) Assignee: Samsung Electronics Co., LTD (KR)

( * ) Notice: Subject to any disclaimer, the term of this patent is extended or adjusted under 35 U.S.C. 154(b) by 0 days.

(21) Appl. No.: 09/539,138

(22) Filed: Mar. 30, 2000

(30) Foreign Application Priority Data

Jul. 29, 1999 (KR) .................................................. 99/31059

(51) Int. Cl.$^7$ .............................. G03F 7/004; C08F 34/02; C08F 10/00

(52) U.S. Cl. .................. 430/270.1; 430/914; 526/271; 526/281; 526/317.1; 526/318

(58) Field of Search ................................ 430/270.1, 914; 526/281, 271, 317.1, 318

(56) References Cited

U.S. PATENT DOCUMENTS

| | | | |
|---|---|---|---|
| 6,045,967 | * | 4/2000 | Jung et al. .......................... 430/270.1 |
| 6,136,499 | * | 10/2000 | Goodall et al. .................... 430/270.1 |
| 6,143,466 | * | 11/2000 | Choi .................................. 430/270.1 |

FOREIGN PATENT DOCUMENTS

2000086725 * 3/2000 (JP) .

OTHER PUBLICATIONS

CA 1997:110129, Nalmasu, O. et al. Microelectron, Eng. 1997, 35 1–4, 133–136.*

CA 2000:198067, Chung et al, JP 000086725, 3–2000, abstract.*

* cited by examiner

Primary Examiner—Rosemary E. Ashton
(74) Attorney, Agent, or Firm—Mills & Onello LLP

(57) ABSTRACT

A photosensitive polymer having a cyclic backbone and containing an alicyclic compound and a resist composition obtained therefrom are provided. The photosensitive polymer has a weight-average molecular weight of between about 3,000–100,000 and represented by the following formula:

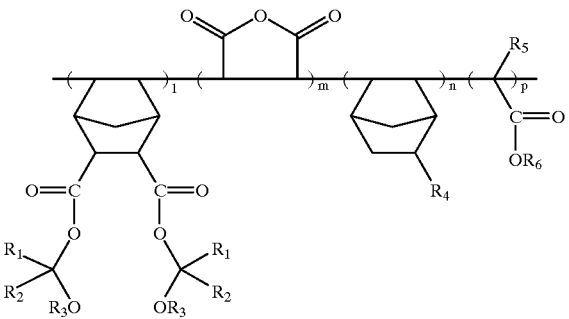

wherein $R_1$, $R_2$ and $R_5$ are independently hydrogen or methyl, $R_3$ is methyl, ethyl, $C_3$ to $C_{20}$ aliphatic hydrocarbon or alicyclic compound, $R_4$ is hydrogen, hydroxy, hydroxymethyl, carboxylic acid, 2-hydroxyethyloxycarbonyl, tert-butoxycarbonyl or alicyclic compound, $R_6$ is hydrogen atom, 2-hydroxyethyl, tert-butyl, isobornyl, adamantyl, norbornyl or menthyl, $l/(l+m+n+p)$ is between about 0.1–0.5, $m/(l+m+n+p)$ is between about 0.3–0.5, $n/(l+m+n+p)$ is between about 0.0–0.3, and $p/(l+m+n+p)$ is between about 0.0–0.3.

11 Claims, No Drawings

PHOTOSENSITIVE POLYMER HAVING CYCLIC BACKBONE AND RESIST COMPOSITION COMPRISING THE SAME

BACKGROUND OF THE INVENTION

1. Field of the Invention

The present invention relates to a chemically amplified resist composition, and more particularly, to a photosensitive polymer having a cyclic backbone, and a resist composition for an ArF excimer laser obtained therefrom.

2. Description of the Related Art

As semiconductor devices become highly integrated and complicated to fabricate, fine pattern formation is required.

Further, as the capacity of a semiconductor device increases to exceed 1 giga bit, a pattern size having a design rule of less than 0.2 μm is required. Accordingly, there are limitations in using a conventional resist material with a KrF excimer laser (248 nm). Thus, a new resist material capable of being developed using an ArF excimer laser (193 nm) has been developed in a lithography process.

The resist material used in the lithography process using the ArF excimer laser has several problems in being commercially used, compared to the conventional resist materials. The most typical problems are transmittance of a polymer and resistance to dry etching. As the widely known ArF resist materials, (meth)acrylate polymers are generally used. In particular, the most typical resist material is a poly(methyl methacrylate-tert-butyl methacrylate-methacrylic acid) terpolymer system manufactured by IBM, Inc. However, such polymers have very weak resistance to dry etching.

Accordingly, to increase the resistance to dry etching, a polymer having a backbone composed of an alicyclic compound such as an isobornyl group, an adamantyl group or a tricyclodecanyl group, is used. However, the resulting resist still exhibits weak resistance to dry etching.

SUMMARY OF THE INVENTION

To solve the above problems, it is an objective of the present invention to provide a photosensitive polymer whose backbone has a cyclic structure and contains an alicyclic compound, for obtaining sufficiently strong resistance to dry etching.

It is another objective of the present invention to provide a resist composition containing the photosensitive polymer suitable for use in a lithography process using an ArF excimer laser.

To achieve the first objective, a photosensitive polymer is provided having a weight-average molecular weight of between about 3,000–100,000 and represented by the following formula:

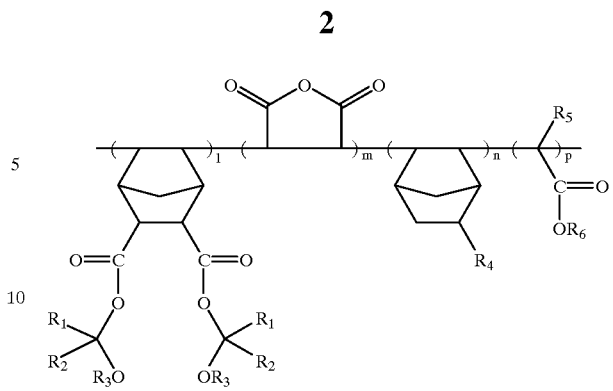

wherein $R_1$, $R_2$ and $R_5$ are independently hydrogen or methyl, $R_3$ is methyl, ethyl, $C_3$ to $C_{20}$ aliphatic hydrocarbon or alicyclic compound, R4 is hydrogen, hydroxy, hydroxymethyl, carboxylic acid, 2-hydroxyethyloxycarbonyl, tert-butoxycarbonyl or alicyclic compound, R6 is hydrogen, 2-hydroxyethyl, tert-butyl, isobornyl, adamantyl, norbornyl or menthyl, $l/(l+m+n+p)$ is between about 0.1–0.5, $m/(l+m+n+p)$ is between about 0.3–0.5, $n/(l+m+n+p)$ is between about 0.0–0.3, and $p/(l+m+n+p)$ is between about 0.0–0.3.

Preferably, $R_3$ is selected from the group consisting of adamantyl, adamantylmethyl, norbornyl, norbornylmethyl, isobornyl, menthyl, isomenthyl and ethyl.

Also, $R_4$ is preferably isobornyloxycarbonyl group.

According to another aspect of the present invention, there is provided a resist composition including (a) a photosensitive polymer having a weight-average molecular weight of between about 3,000–100,000 and represented by the following formula:

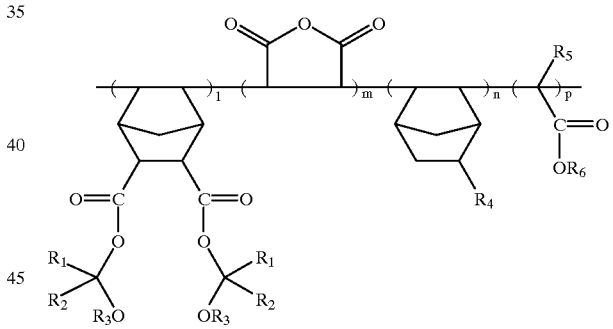

wherein $R_1$, $R_2$ and $R_5$ are independently hydrogen or methyl, $R_3$ is methyl, ethyl, $C_3$ to $C_{20}$ aliphatic hydrocarbon or alicyclic compound, $R_4$ is hydrogen, hydroxy, hydroxymethyl, carboxylic acid, 2-hydroxyethyloxycarbonyl, tert-butoxycarbonyl or alicyclic compound, R6 is hydrogen, 2-hydroxyethyl, tert-butyl, isobornyl, adamantyl, norbornyl or menthyl, $l/(l+m+n+p)$ is between about 0.1–0.5, $m/(l+m+n+p)$ is between about 0.3–0.5, $n/(l+m+n+p)$ is between about 0.0–0.3, and $p/(l+m+n+p)$ is between about 0.0–0.3, and (b) a photoacid generator (PAG).

Preferably, the PAG is contained in the composition in an amount of between about 1–15 weight percent based on the weight of the polymer.

The PAG may be selected from the group consisting of triarylsulfonium salts, diaryliodonium salts, sulfonates, and mixtures thereof may be used.

The resist composition may further include an organic base. The organic base is preferably contained in the composition in an amount of between about 0.01–2.0 weight percent based on the weight of the polymer.

The organic base may be selected from the group consisting essentially of triethyl amine, triisobutylamine, triisooctylamine, diethanol amine, triethanol amine, and mixtures thereof may be used.

According to the present invention, a photosensitive polymer is provided whose backbone has a cyclic structure and contains an alicyclic compound, thereby attaining resistance to dry etching.

DESCRIPTION OF THE PREFERRED EMBODIMENTS

EXAMPLE 1

Synthesis of 2,3-di-menthoxymethyloxycarbonyl 5-norbornene

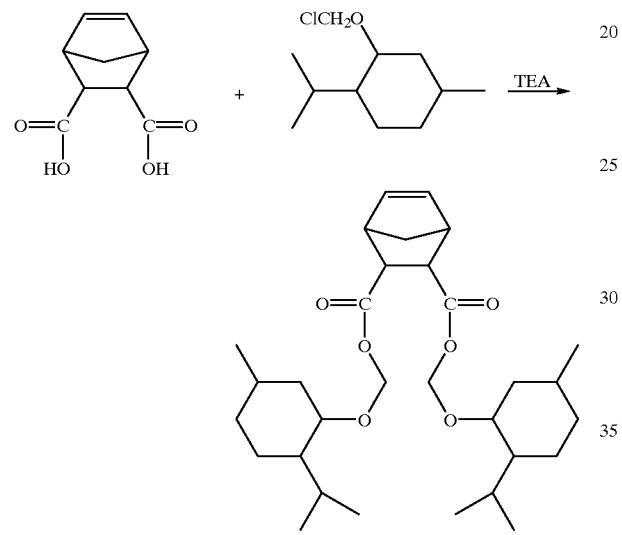

5-norbornene-2-carboxylic acid (0.11 mol) and triethylamine (0.12 mol) were reacted in 150 ml of methylene chloride; chloromethyl menthyl ether (0.1 mol) was slowly added thereto, and the reactant was reacted under a reflux condition for about 12 hours.

After the reaction was completed, the reactant was poured into excess water and neutralized using HCl. Thereafter, the product was extracted using methylene chloride to then separate a desired product using column chromatography (ethyl acetate: hexane=1:3) (yield: 75%).

EXAMPLE 2

Synthesis of 2,3-di-adamantoxymethyloxycarbonyl 5-norbornene

The reaction was carried out in the same manner as in Example 1 using chloromethyl adamantyl ether (0.1 mol) and then the product was separated.

EXAMPLE 3

Synthesis of 2,3-di-isobornyloxymethyloxycarbonyl 5-norbornene

The reaction was carried out in the same manner as in Example 1 using chloromethyl isobornyl ether (0.1 mol) and then the product was separated.

EXAMPLE 4

Synthesis of 2,3-di-ethoxymethyloxycarbonyl 5-norbornene

The reaction was carried out in the same manner as in Example 1 using chloromethyl ethyl ether (0.1 mol) and then the product was separated.

EXAMPLE 5

Synthesis of Copolymer

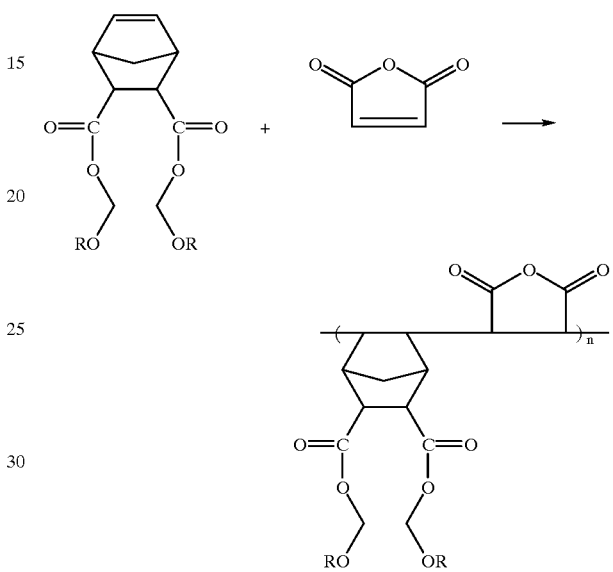

5-1. Synthesis of Copolymer Wherein R is Menthyl 26 g of monomer synthesized in Example 1 (50 mmol), 4.9 g of maleic anhydride (50 mmol) and 0.17 g of azobis (isobutyronitrile) (AIBN) were dissolved in 16 g of anhydrous dioxane, and degassed using ampule by a freezing method. Thereafter, the reactant was polymerized at 70° C. for about 24 hours.

After the polymerization was completed, the reactant was slowly dropped into excess n-hexane to be precipitated, dissolved again in Tetrahydrofuran (THF) and reprecipitated in a co-solvent (n-hexane:isopropylalcohol=8:2) to obtain the polymer (yield: 40%).

The weight-average molecular weight and polydispersity of the obtained product were 12,600 and 1.8, respectively.

5-2. Synthesis of Copolymer Wherein R is Adamantyl

Polymerization was carried out using the monomer synthesized in Example 2 (50 mmol) and 4.9 g of maleic anhydride (50 mmol) in the same manner as in Example 5-1 to then obtain the polymer in the same precipitation method as in Example 5-1.

The weight-average molecular weight and polydispersity of the obtained product were 13,700 and 1.9, respectively.

5-3. Synthesis of Copolymer Wherein R is Isobornyl

Polymerization was carried out using the monomer synthesized in Example 3 (50 mmol) and 4.9 g of maleic anhydride (50 mmol) in the same manner as in Example 5-1 to then obtain the polymer in the same precipitation method as in Example 5-1.

The weight-average molecular weight and polydispersity of the obtained product were 13,300 and 2.0, respectively.

5-4. Synthesis of Copolymer Wherein R is Ethyl

Polymerization was carried out using the monomer synthesized in Example 4 (50 mmol) and 4.9 g of maleic anhydride (50 mmol) in the same manner as in Example 5-1 to then obtain the polymer in the same precipitation method as in Example 5-1.

The weight-average molecular weight and polydispersity of the obtained product were 12,700 and 1.8, respectively.

EXAMPLE 6

Synthesis of Terpolymer

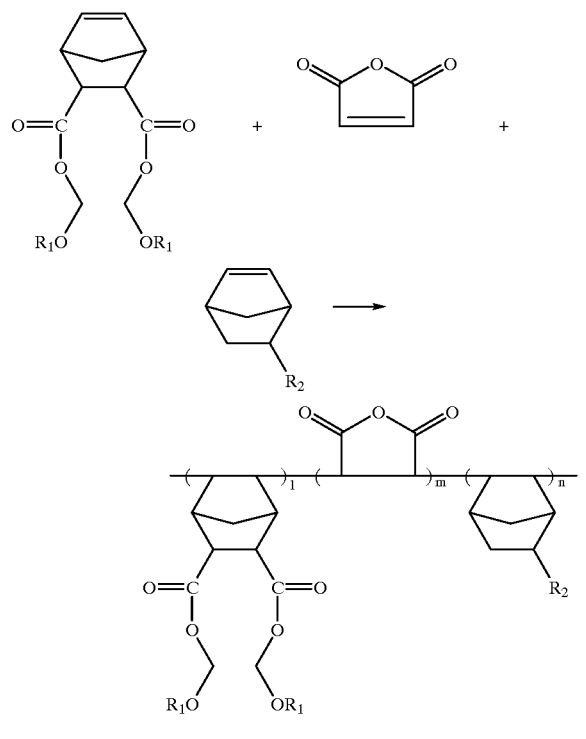

6-1. Synthesis of Terpolymer Wherein $R_1$ is Menthyl and $R_2$ is Hydroxymethyl 13 g of the monomer synthesized in Example 1 (25 mmol), 3.1 g of 5-norbornene-2-methanol (25 mmol), 4.9 g of maleic anhydride (50 mmol) and 0.17 g of azobis(isobutyronitrile) (AIBN) were dissolved in 10 g of anhydrous dioxane, and degassed using ampule by a freezing method. Thereafter, the reactant was polymerized at 70° C. for about 24 hours.

After the polymerization was completed, the reactant was slowly dropped into excess n-hexane to be precipitated, dissolved again in THF and reprecipitated in a co-solvent (n-hexane:isopropylalcohol=10:1) to obtain the polymer (yield: 40%).

The weight-average molecular weight and polydispersity of the obtained product were 12,600 and 1.8, respectively.

6-2. Synthesis of Terpolymer Wherein $R_1$ is Menthyl and $R_2$ is Carboxylic Acid Polymerization was carried out using the monomer synthesized in Example 1 (40 mmol), 5-norbornene-2-carboxylic acid (10 mmol) and maleic anhydride (50 mmol) in the same manner as in Example 6-1, and then the polymer was obtained using the same precipitation method as in Example 6-1.

The weight-average molecular weight and polydispersity of the obtained product were 13,700 and 1.9, respectively.

6-3. Synthesis of Terpolymer Wherein $R_1$ is Adamantyl and $R_2$ is Hydroxymethyl Polymerization was carried out using the monomer synthesized in Example 2 (30 mmol), 5-norbornene-2-methanol (20 mmol) and maleic anhydride (50 mmol) in the same manner as in Example 6-1, and then the polymer was obtained using the same precipitation method as in Example 6-1.

The weight-average molecular weight and polydispersity of the obtained product were 13,300 and 2.0, respectively.

6-4. Synthesis of Terpolymer Wherein $R_1$ is Adamantyl and $R_2$ is Carboxylic Acid Polymerization was carried out using the monomer synthesized in Example 2 (40 mmol), 5-norbornene-2-carboxylic acid (10 mmol) and maleic anhydride (50 mmol) in the same manner as in Example 6-1, and then the polymer was obtained using the same precipitation method as in Example 6-1.

The weight-average molecular weight and polydispersity of the obtained product were 13,700 and 1.9, respectively.

EXAMPLE 7

Synthesis of Terpolymer

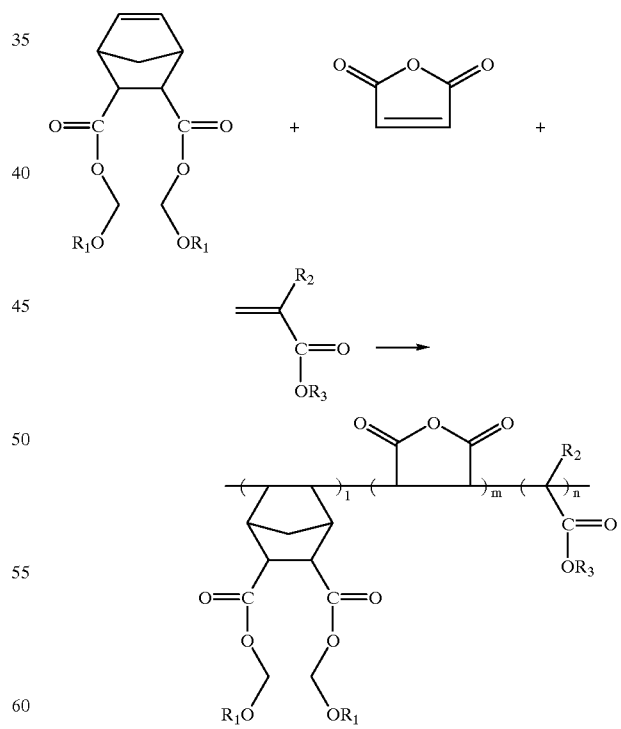

7-1. Synthesis of Terpolymer Wherein $R_1$ is Menthyl, $R_2$ and $R_3$ are Hydrogen 26 g of the monomer synthesized in Example 1 (50 mmol), 0.7 g of acrylate (10 mmol), 4.9 g of maleic anhydride (50 mmol) and 0.18 g of azobis(isobutyronitrile) (AIBN) were dissolved in 32 g of anhydrous dioxane, and degassed using ampule by a freezing method. Thereafter, the reactant was polymerized at 70° C. for about 24 hours.

After the polymerization was completed, the reactant was slowly dropped into excess n-hexane to be precipitated, dissolved again in THF and reprecipitated in a co-solvent (n-hexane:isopropylalcohol=10:1) to obtain the polymer (yield: 50%).

The weight-average molecular weight and polydispersity of the obtained product were 12,600 and 2.2, respectively.

7-2. Synthesis of Terpolymer Wherein $R_1$ is Menthyl, $R_2$ is Hydrogen and $R_3$ is Hydroxyethyl Polymerization was carried out using the monomer synthesized in Example 1 (40 mmol), 2-hydroxyethyl acrylate (20 mmol) and maleic anhydride (40 mmol) in the same manner as in Example 7-1, and then the polymer was obtained using the same precipitation method as in Example 7-1.

The weight-average molecular weight and polydispersity of the obtained product were 13,700 and 2.0 respectively.

7-3. Synthesis of Terpolymer Wherein $R_1$ is Adamantyl, $R_2$ is Methyl and $R_3$ is Hydrogen Polymerization was carried out using the monomer synthesized in Example 2 (40 mmol), methacrylic acid (10 mmol) and maleic anhydride (40 mmol) in the same manner as in Example 7-1, and then the polymer was obtained using the same precipitation method as in Example 7-1.

The weight-average molecular weight and polydispersity of the obtained product were 13,300 and 2.2, respectively.

7-4. Synthesis of Terpolymer Wherein $R_1$ is Adamantyl, $R_2$ is Methyl and $R_3$ is 2-Hydroxyethyl Polymerization was carried out using the monomer synthesized in Example 2 (40 mmol), 2-hydroxyethyl methacrylate (30 mmol) and maleic anhydride (40 mmol) in the same manner as in Example 7-1, and then the polymer was obtained using the same precipitation method as in Example 7-1.

The weight-average molecular weight and polydispersity of the obtained product were 13,700 and 2.1, respectively.

7-5. Synthesis of Terpolymer Wherein $R_1$ is Isobornyl, $R_2$ is Methyl and $R_3$ is Hydrogen Polymerization was carried out using the monomer synthesized in Example 3 (40 mmol), methacrylic acid (15 mmol) and maleic anhydride (40 mmol) in the same manner as in Example 7-1, and then the polymer was obtained using the same precipitation method as in Example 7-1.

The weight-average molecular weight and polydispersity of the obtained product were 13,700 and 2.0, respectively.

7-6. Synthesis of Terpolymer Wherein $R_1$ is Ethyl, $R_2$ is Hydrogen and $R_3$ is Isobornyl Polymerization was carried out using the monomer synthesized in Example 4 (40 mmol), isobornyl acrylate (10 mmol) and maleic anhydride (40 mmol) in the same manner as in Example 7-1, and then the polymer was obtained using the same precipitation method as in Example 7-1.

The weight-average molecular weight and polydispersity of the obtained product were 13,700 and 2,3, respectively.

EXAMPLE 8

Synthesis of Tetrapolymer 7.5 g of the monomer synthesized in Example 4 (25 mmol), 3.1 g of 5-norbornene-2-methanol (25 mmol), 2.1 g of isobornyl acrylate (10 mmol), 4.9 g of maleic anhydride (50 mmol), and 0.18 g of azobis(isobutyronitrile) (AIBN) were dissolved in 20 g of anhydrous dioxane, and degassed using ampule by a freezing method. Thereafter, the reactant was polymerized at 70° C. for about 24 hours.

After the polymerization was completed, the reactant was slowly dropped into excess n-hexane to be precipitated, dissolved again in THF and reprecipitated in a co-solvent (n-hexane:isopropylalcohol=9: 1) to obtain the polymer (yield: 45%).

The weight-average molecular weight and polydispersity of the obtained product were 12,600 and 2.2, respectively.

EXAMPLE 9

Synthesis of Tetrapolymer

Polymerization was carried out using the monomer synthesized in Example 4 (30 mmol), 5-norbornene-2-carboxylic acid (20 mmol), isobornyl acrylate (10 mmol) and maleic anhydride (50 mmol) in the same manner as in Example 8, and then the polymer was obtained using the same precipitation method as in Example 8.

The weight-average molecular weight and polydispersity of the obtained product were 12,300 and 2,3, respectively.

EXAMPLE 10

Patterning Process Using Resist Composition

Hereinbelow, the following processes were used for preparing the resist compositions used in a patterning process.

1.0 g of polymer selected from polymers synthesized in Examples 5 through 9, 20 mg of triphenyl sulfonium triflate as a photoacid generator and 2 mg of triisobutylamine as an organic base were completely dissolved in 6.0 g of propylene glycol monomethyl ether acetate (PGMEA). Thereafter, the solution was filtered using a 0.2 $\mu$m membrane filter to obtain a resist composition. Then, for a patterning process using the resist composition obtained by the above method, the following processes were used.

A silicon wafer having a silicon oxide film formed thereon was prepared and treated with hexamethyldisilazane (HMDS). Then, the resist composition was coated on the silicon oxide film to a thickness of about 0.4 $\mu$m.

The wafer having the resist composition coated thereon was pre-baked at a temperature of 100 to 130° C. for 60 to 120 seconds and exposed to light using a KrF excimer laser having a numerical aperture of 0.45 or an ArF excimer laser having a numerical aperture of 0.6. Then, post exposure baking (PEB) was performed at a temperature of 100 to 140° C. for 60 to 120 seconds.

Thereafter, the resultant was developed using 2.38 wt % of tetramethylammonium hydroxide (TMAH) solution for 20 to 60 seconds. As a result, the silicon oxide film was etched with a predetermined etching gas using the obtained resist pattern as a mask. Subsequently, the resist pattern remaining on the silicon wafer was removed using a stripper to form a desired silicon oxide pattern.

Next, detailed examples of forming patterns using the resist composition prepared in the same method as in Example 10 will be described.

EXAMPLE 10-1

A resist composition was prepared using 1.0 g of polymer synthesized in Example 5-4 in the same method as in Example 10 and the obtained resist composition was coated on a wafer.

Thereafter, the wafer having the resist composition coated thereon was pre-baked at a temperature of 110° C. for 90 seconds and exposed to light using a KrF excimer laser having a numerical aperture of 0.45. Then, post exposure baking (PEB) was performed at a temperature of 110° C. for 90 seconds.

The resultant was developed using 2.38 wt % of TMAH solution for about 60 seconds to form a resist pattern. As a result, when an exposure dose was about 23 mJ/cm$^2$, it was observed that a 0.5 μm line and space pattern was obtained.

EXAMPLE 10-2

A resist composition was prepared using 1.0 g of the polymer synthesized in Example6-1, 30 mg of triphenylsulfonium triflate as a PAG and 3 mg of triethanolamine as an organic base in the same method as in Example 10 and the obtained resist composition was coated on a wafer.

Thereafter, the wafer having the resist composition coated thereon was pre-baked at a temperature of 110° C. for 90 seconds and exposed to light using a KrF excimer laser having a numerical aperture of 0.45. Then, post exposure baking (PEB) was performed at a temperature of 120° C. for 90 seconds.

The resultant was developed using 2.38 wt % of TMAH solution for about 60 seconds to form a resist pattern.

As a result, when an exposure dose was about 21 mJ/cm$^2$, it was observed that a 0.4 μm line and space pattern was obtained.

EXAMPLE 10-3

A resist composition was prepared using 1.0 g of the polymer synthesized in Example 6-4 in the same method as in Example 10 and the obtained resist composition was coated on a wafer.

Thereafter, the wafer having the resist composition coated thereon was pre-baked at a temperature of 110° C. for 90 seconds and exposed to light using an ArF excimer laser having a numerical aperture of 0.6. Then, post exposure baking (PEB) was performed at a temperature of 110° C. for 90 seconds.

The resultant was developed using 2.38 wt % of TMAH solution for about 60 seconds to form a resist pattern.

As a result, when an exposure dose was about 11 mJ/cm$^2$, it was observed that a 0.3 μm line and space pattern was obtained.

EXAMPLE 10-4

A resist composition was prepared using 1.0 g of the polymer synthesized in Example 7-2 in the same method as in Example 10 and the obtained resist composition was coated on a wafer.

Thereafter, the wafer having the resist composition coated thereon was pre-baked at a temperature of 120° C. for 90 seconds and exposed to light using an ArF excimer laser having a numerical aperture of 0.6. Then, post exposure baking (PEB) was performed at a temperature of 120° C. for 90 seconds.

The resultant was developed using 2.38 wt % of TMAH solution for about 45 seconds to form a resist pattern.

As a result, when an exposure dose was about 14 mJ/cm$^2$, it was observed that a 0.3 μm line and space pattern was obtained.

EXAMPLE 10-5

A resist composition was prepared using 1.0 g of the polymer synthesized in Example 7-3 in the same method as in Example 10 and the obtained resist composition was coated on a wafer.

Thereafter, the wafer having the resist composition coated thereon was pre-baked at a temperature of 120° C. for 90 seconds and exposed to light using an ArF excimer laser having a numerical aperture of 0.6. Then, post exposure baking (PEB) was performed at a temperature of 120° C. for 90 seconds.

The resultant was developed using 2.38 wt % of TMAH solution for about 60 seconds to form a resist pattern.

As a result, when an exposure dose was about 13 mJ/cm$^2$, it was observed that a 0.3 μm line and space pattern was obtained.

EXAMPLE 10-6

A resist composition was prepared using 1.0 g of the polymer synthesized in Example 8, 30 mg of triphenylsulfornium triflate as a PAG and 3 mg of triethanolamine as an organic base in the same method as in Example 10 and the obtained resist composition was coated on a wafer.

Thereafter, the wafer having the resist composition coated thereon was pre-baked at a temperature of 110° C. for 90 seconds and exposed to light using a KrF excimer laser having a numerical aperture of 0.45. Then, post exposure baking (PEB) was performed at a temperature of 120° C. for 90 seconds.

The resultant was developed using 2.38 wt % of TMAH solution for about 60 seconds to form a resist pattern.

As a result, when an exposure dose was about 21 mJ/cm$^2$, it was observed that a 0.5 μm line and space pattern was obtained.

EXAMPLE 10-7

A resist composition was prepared using 1.0 g of the polymer synthesized in Example 9, 30 mg of triphenylsulfornium triflate as a PAG and 3 mg of triisobutylamine as an organic base in the same method as in Example 10 and the obtained resist composition was coated on a wafer.

Thereafter, the wafer having the resist composition coated thereon was pre-baked at a temperature of 110° C. for 90 seconds and exposed to light using a KrF excimer laser having a numerical aperture of 0.45. Then, post exposure baking (PEB) was performed at a temperature of 120° C. for 90 seconds.

The resultant was developed using 2.38 wt % of TMAH solution for about 60 seconds to form a resist pattern.

As a result, when an exposure dose was about 25 mJ/cm$^2$, it was observed that a 0.4 μm line and space pattern was obtained.

As described above, according to the present invention, by providing a polymer whose backbone has a cyclic structure and contains an alicyclic compound, sufficiently increased dry etching resistance can be obtained.

Also, adhesiveness to an underlying film material can be increased by introducing various comonomers which increase adhesiveness of a resist composition to form a copolymer. Further, the resist can be patterned using a general developer solution, i.e., 2.38 wt % TMAH solution.

Therefore, the resist composition having a polymer according to the present invention can obtain sufficient dry etching resistance. Also, excellent lithographic performance can be obtained using the resist composition obtained from the polymer, and the resist composition according to the present invention can be useful in the manufacture of next generation semiconductor devices.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A photosensitive polymer having a weight-average molecular weight of between about 3,000–100,000 and represented by the following formula:

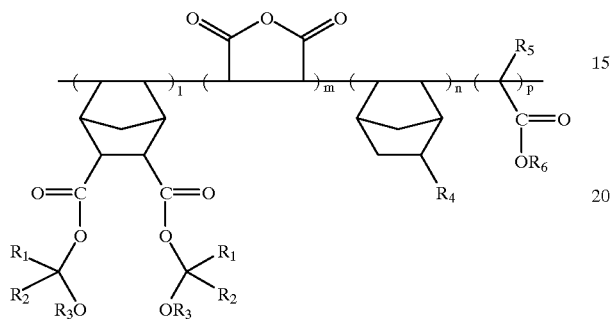

wherein $R_1$, $R_2$ and $R_5$ are independently hydrogen or methyl, $R_3$ is methyl, ethyl, $C_3$ to $C_{20}$ aliphatic hydrocarbon or alicyclic compound, $R_4$ is hydrogen, hydroxy, hydroxymethyl, carboxylic acid, 2-hydroxyethyloxycarbonyl, tert-butoxycarbonyl or alicyclic compound, $R_6$ is hydrogen atom, 2-hydroxyethyl, tert-butyl, isobornyl, adamantyl, norbornyl or menthyl, $l/(l+m+n+p)$ is between about 0.1–0.5, $m/(l+m+n+p)$ is between about 0.3–0.5, $n/(l+m+n+p)$ is between about 0.0–0.3, and $p/(l+m+n+p)$ is between about 0.0–0.3.

2. The photosensitive polymer according to claim 1, wherein $R_3$ is one selected from the group consisting of adamantyl, adamantylmethyl, norbornyl, norbornylmethyl, isobornyl, menthyl, isomenthyl and ethyl.

3. The photosensitive polymer according to claim 1, wherein $R_4$ is isobornyloxycarbonyl.

4. A resist composition comprising:
(a) a photosensitive polymer having a weight-average molecular weight of between about 3,000–100,000 and represented by the following formula:

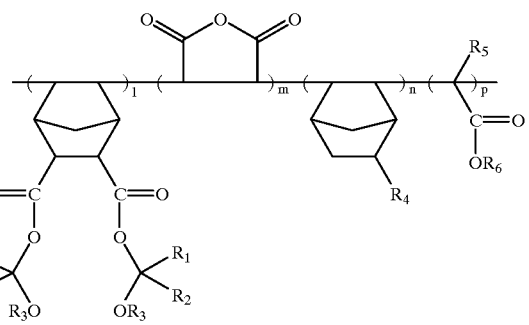

wherein $R_1$, $R_2$ and $R_5$ are independently hydrogen or methyl, $R_3$ is methyl, ethyl, $C_3$ to $C_{20}$ aliphatic hydrocarbon or alicyclic compound, R4 is hydrogen, hydroxy, hydroxymethyl, carboxylic acid, 2-hydroxyethyloxycarbonyl, tert-butoxycarbonyl or alicyclic compound, $R_3$ is hydrogen, 2-hydroxyethyl, tert-butyl, isobornyl, adamantyl, norbornyl or menthyl, $l(l+m+n+p)$ is between about 0.1–0.5, $m/(l+m+n+p)$ is between about 0.3–0.5, $n/(l+m+n+p)$ is between about 0.0–0.3; and $p/(l+m+n+p)$ is between about 0.0–0.3; and
(b) a photoacid generator.

5. The resist composition according to claim 4, wherein $R_3$ is one selected from the group consisting of adamantyl, adamantylmethyl, norbornyl, norbornylmethyl, isobornyl, menthyl, isomenthyl and ethyl.

6. The resist composition according to claim 4, wherein $R_4$ is isobornyloxycarbonyl group.

7. The resist composition according to claim 4, wherein the photoacid generator is contained in the composition in an amount of between about 1–15 weight percent based on the weight of the polymer.

8. The resist composition according to claim 4, wherein the photoacid generator is selected from the group consisting of triarylsulfonium salts, diaryliodonium salts, sulfonates, and mixtures thereof.

9. The resist composition according to claim 4, further comprising an organic base.

10. The resist composition according to claim 9, wherein the organic base is contained in the composition in an amount of between about 0.01–2.0 weight percent based on the weight of the polymer.

11. The resist composition according to claim 9, wherein the organic base is selected from the group consisting of triethyl amine, triisobutylamine, triisooctylamine, diethanol amine, triethanol amine, and mixtures thereof.

* * * * *

UNITED STATES PATENT AND TRADEMARK OFFICE
CERTIFICATE OF CORRECTION

PATENT NO. : 6,270,942 B1  
DATED : August 7, 2001  
INVENTOR(S) : Sang-jun Choi Page 1 of 1

It is certified that error appears in the above-identified patent and that said Letters Patent is hereby corrected as shown below:

<u>Claim 4,</u>
Line 20, please change "$R_3$" to -- $R_6$ --.
Line 22, please change "1(1+m+n+p)" to -- 1/(1+m+n+p) --.
Line 24, please change the first occurrence of "0.0-0.3;" to -- 0.0-0.3, --.

Signed and Sealed this

Second Day of April, 2002

Attest:

JAMES E. ROGAN  
*Attesting Officer*  *Director of the United States Patent and Trademark Office*